(12) United States Patent
Fujii (10) Patent No.: US 7,859,534 B2
(45) Date of Patent: Dec. 28, 2010

(54) MEASURING DEVICE, GRAPHICS GENERATING METHOD, PROGRAM AND RECORDING MEDIUM

(75) Inventor: Yasuo Fujii, Chiba (JP)

(73) Assignee: Advantest Corporation, Tokyo (JP)

( * ) Notice: Subject to any disclaimer, the term of this patent is extended or adjusted under 35 U.S.C. 154(b) by 719 days.

(21) Appl. No.: 11/909,322

(22) PCT Filed: Mar. 24, 2005

(86) PCT No.: PCT/JP2005/006197

§ 371 (c)(1),
(2), (4) Date: Nov. 8, 2007

(87) PCT Pub. No.: WO2006/100784

PCT Pub. Date: Sep. 28, 2006

(65) Prior Publication Data

US 2008/0252644 A1    Oct. 16, 2008

(51) Int. Cl.
*G06T 11/20* (2006.01)
*G01R 13/02* (2006.01)

(52) U.S. Cl. .......................................... 345/440; 702/67

(58) Field of Classification Search ................. 345/440, 345/440.1, 440.2; 702/67
See application file for complete search history.

(56) References Cited

U.S. PATENT DOCUMENTS

| | | | | |
|---|---|---|---|---|
| 4,577,188 A | * | 3/1986 | Inami et al. | 345/23 |
| 4,682,248 A | * | 7/1987 | Schwartz | 360/32 |
| 5,434,954 A | * | 7/1995 | Kawauchi et al. | 345/440 |
| 5,474,082 A | * | 12/1995 | Junker | 600/545 |
| 5,519,820 A | * | 5/1996 | Kawauchi et al. | 345/440 |
| 5,579,463 A | * | 11/1996 | Takano et al. | 345/440 |
| 5,617,523 A | * | 4/1997 | Imazu et al. | 345/440 |
| 5,692,517 A | * | 12/1997 | Junker | 600/545 |
| 6,184,898 B1 | * | 2/2001 | Rice et al. | 345/440 |
| 7,236,900 B2 | * | 6/2007 | Hagen et al. | 702/67 |
| 7,620,509 B2 | * | 11/2009 | Cameron | 702/75 |
| 2002/0093991 A1 | | 7/2002 | Kurihara et al. | |
| 2003/0086511 A1 | | 5/2003 | Helal et al. | |

FOREIGN PATENT DOCUMENTS

| JP | 11-153631 | 6/1999 |
|---|---|---|
| JP | 2002-57651 | 2/2002 |
| JP | 2003-179577 | 6/2003 |

OTHER PUBLICATIONS

English language abstract of JP 11-153631.
English language abstract of JP 2002-57651.
English language abstract of JP 2003-179577.

* cited by examiner

*Primary Examiner*—Ryan R Yang
(74) *Attorney, Agent, or Firm*—Greenblum & Bernstein, P.L.C.

(57) ABSTRACT

There is provided a measuring device including an EVM measuring unit 32 which measures, in association with time, a physical quantity (EVM) of an RF signal, which uses different frequency bands according to time, a used band determining unit 36 which determines the type of the frequency band used by the RF signal in association with time, an EVM graph generating unit 42 which generates an EVM graph used to display an EVM on a display device 49 in association with a time axis, and a band graph generating unit 46 which generates a band graph used to display the type of the frequency band on the display device 49 in association with the time axis, where the band graph is a graphic having a predetermined height in a direction vertical to the time axis.

10 Claims, 11 Drawing Sheets

| Band ID | Frequency (MHz) | | |
|---|---|---|---|
| | Lower Limit | Center | Upper Limit |
| #1 | 3168 | 3432 | 3696 |
| #2 | 3696 | 3960 | 4224 |
| #3 | 4224 | 4488 | 4752 |

Band ID#1

MEASURING DEVICE, GRAPHICS GENERATING METHOD, PROGRAM AND RECORDING MEDIUM

TECHNICAL FIELD

The present invention relates to a display of a result of a modulation analysis of a hopping radio signal.

BACKGROUND ART

There has been known a communication technology which uses a very wide band referred to as UWB (Ultra Wide Band) (refer to Patent Document 1 (Japanese Laid-Open Patent Publication (Kokai) No. 2003-179577), for example). The UWB uses frequency hopping which changes the frequency used for respective symbols.

It is also widely known that an EVM (Error Vector Magnitude) and a phase error of a UWB signal are measured in association with the time axis.

Figure 11:
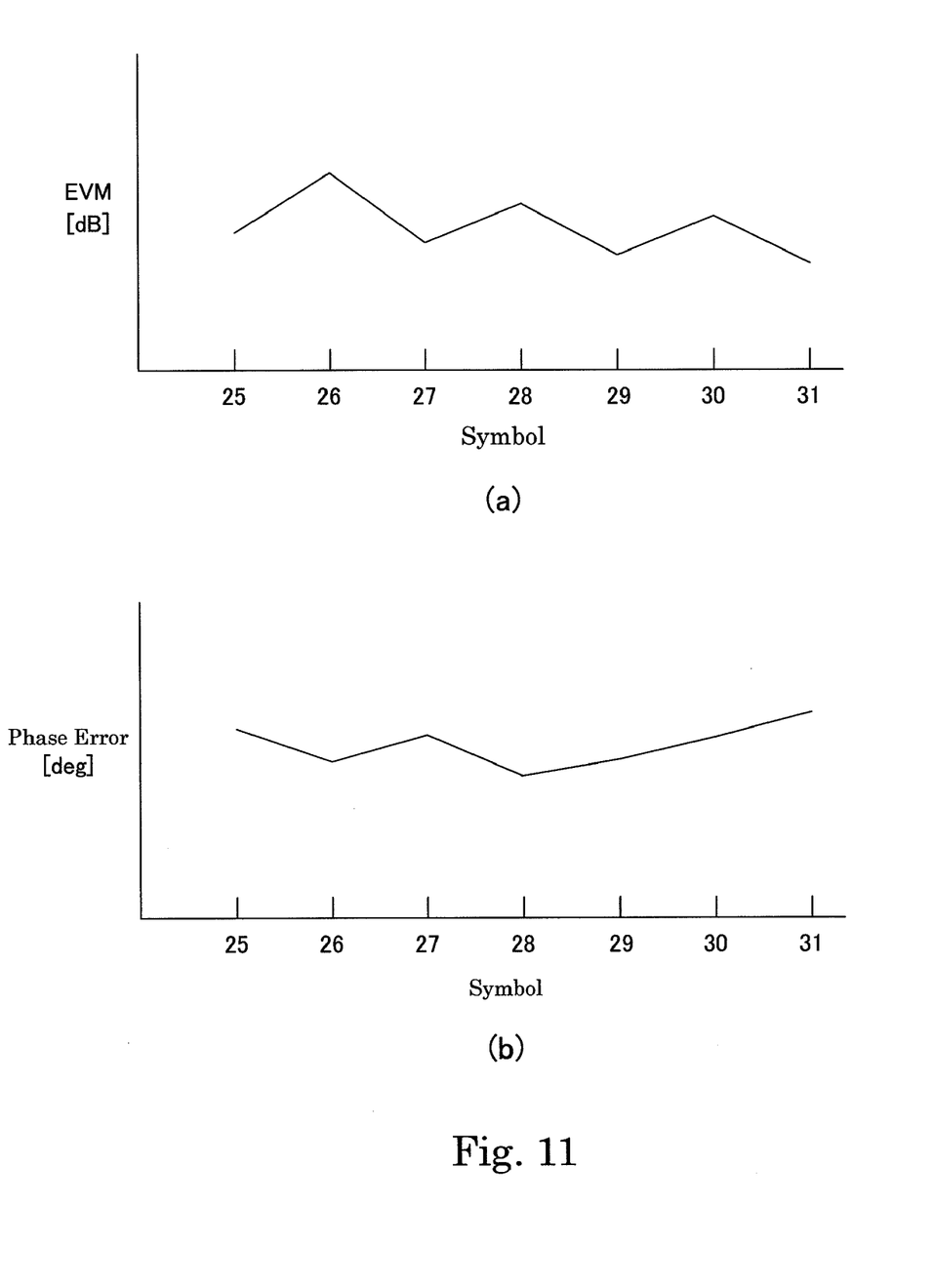
FIG. 11(a) shows a graph displaying the EVM of the UWB signal in association with the time axis.
FIG. 11(b) shows a graph displaying the phase error of the UWB signal in association with the time axis.

FIG. 11(a) shows a graph displaying the EVM of the UWB signal in association with the time axis, and FIG. 11(b) shows a graph displaying the phase error of the UWB signal in association with the time axis. It should be noted that the time axis is assigned to the horizontal axis and time is represented as symbols (symbols 25 to 31 are shown) in FIGS. 11(a) and 11(b). According to the graphs shown in FIGS. 11(a) and 11(b), it is possible to know an EVM and a phase error at a certain time point (symbol).

However, it is not possible to know to which frequency band an EVM or a phase error corresponds to according to the graphs shown in FIGS. 11(a) and 11(b). For example, it is assumed that the UWB signal uses a first frequency band for symbols 25, 28, 31, . . . , uses a second frequency band for symbols 26, 29, 32, . . . , and uses a third frequency band for symbols 27, 30, 33, . . . . It is not possible to determine which of the first, second, or third frequency band an EVM or a phase error corresponds to by just viewing the graphs shown in FIGS. 11(a) and 11(b).

It is therefore an object of the present invention to display which frequency band physical quantities (such as the EVM and the phase error) of a signal using the frequency hopping correspond to.

DISCLOSURE OF THE INVENTION

According to the present invention, a measuring device includes: a physical quantity measuring unit that measures, in association with time, a physical quantity of a signal, which uses different frequency bands according to time; a band type determining unit that determines the type of the frequency band used by the signal in association with time; a physical quantity display graphic generating unit that generates a physical quantity display graphic used to display the physical quantity on a display device in association with a time axis; and a band display graphic generating unit that generates a band display graphic used to display the type of the frequency band on the display device in association with the time axis, wherein the band display graphic is a graphic having a predetermined height in a direction perpendicular to the time axis.

According to the thus constructed measuring device, a physical quantity measuring unit measures, in association with time, a physical quantity of a signal, which uses different frequency bands according to time. A band type determining unit determines the type of the frequency band used by the signal in association with time. A physical quantity display graphic generating unit generates a physical quantity display graphic used to display the physical quantity on a display device in association with a time axis. A band display graphic generating unit generates a band display graphic used to display the type of the frequency band on the display device in association with the time axis. The band display graphic is a graphic having a predetermined height in a direction perpendicular to the time axis.

According to the measuring device of the present invention, the band display graphic may be different in color or pattern according to the type of the frequency band.

According to the measuring device of the present invention, the physical quantity may be an EVM or a phase error.

According to the measuring device of the present invention, a symbol of the signal may be displayed on the time axis.

According to the measuring device of the present invention, the physical quantity display graphic may be formed by connecting display point whose distance from the time axis corresponds to the physical quantity.

According to the measuring device of the present invention, the predetermined height of the band display graphic may correspond to the physical quantity.

According to the measuring device of the present invention, the predetermined height of the band display graphic may be constant.

According to the measuring device of the present invention, the band display graphic may be displayed only for a specific frequency band.

According to the present invention, a measuring method includes: a physical quantity measuring step that measures, in association with time, a physical quantity of a signal, which uses different frequency bands according to time; a band type determining step that determines the type of the frequency band used by the signal in association with time; a physical quantity display graphic generating step that generates a physical quantity display graphic used to display the physical quantity on a display device in association with a time axis; and a band display graphic generating step that generates a band display graphic used to display the type of the frequency band on the display device in association with the time axis, wherein the band display graphic is a graphic having a predetermined height in a direction perpendicular to the time axis.

The present invention is a program of instructions for execution by the computer to perform a measuring processing; the measuring processing including: a physical quantity measuring step that measures, in association with time, a physical quantity of a signal, which uses different frequency bands according to time; a band type determining step that determines the type of the frequency band used by the signal in association with time; a physical quantity display graphic generating step that generates a physical quantity display graphic used to display the physical quantity on a display device in association with a time axis; and a band display graphic generating step that generates a band display graphic used to display the type of the frequency band on the display device in association with the time axis, wherein the band display graphic is a graphic having a predetermined height in a direction perpendicular to the time axis.

The present invention is a computer-readable medium having a program of instructions for execution by the computer to perform a measuring processing; the measuring processing including: a physical quantity measuring step that measures, in association with time, a physical quantity of a signal, which uses different frequency bands according to time; a band type determining step that determines the type of the frequency band used by the signal in association with time; a physical quantity display graphic generating step that generates a physical quantity display graphic used to display the physical quantity on a display device in association with a time axis; and a band display graphic generating step that generates a band display graphic used to display the type of the frequency band on the display device in association with the time axis, wherein the band display graphic is a graphic having a predetermined height in a direction perpendicular to the time axis.

BRIEF DESCRIPTION OF THE DRAWINGS

FIG. 7 is an illustration showing a first variation of a band graph 46a;

FIG. 8 is an illustration showing a second variation of the band graph 46a;

BEST MODE FOR CARRYING OUT THE INVENTION

A description will now be given of an embodiment of the present invention with reference to drawings.

Figure 1:
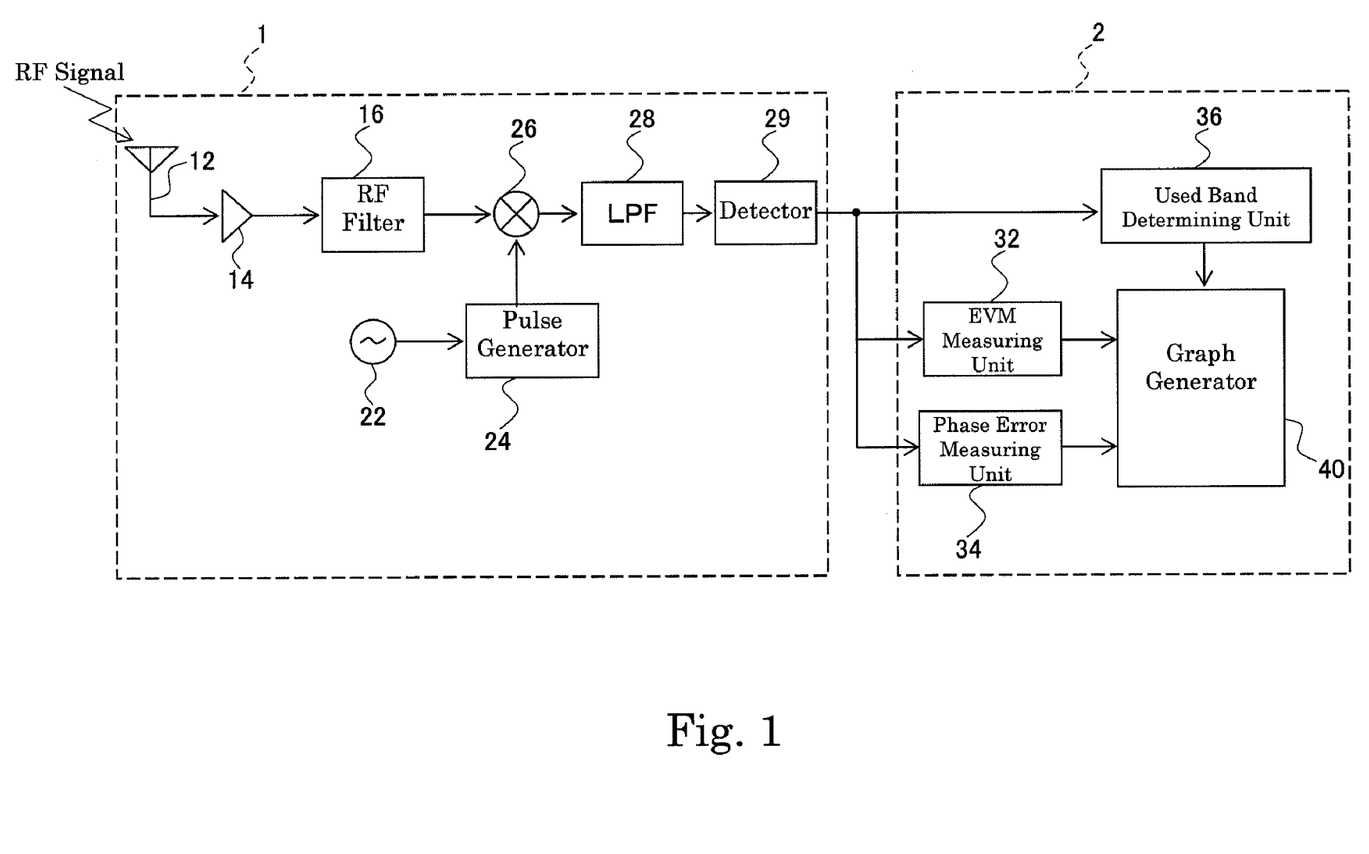
FIG. 1 is a functional block diagram showing a configuration of a graph display device 2 according to an embodiment of the present invention.

FIG. 1 is a functional block diagram showing a configuration of a graph display device 2 according to the embodiment of the present invention.

A signal receiving device 1 receives an RF (Radio Frequency) signal using frequency hopping, demodulates the RF signal, and supplies the graph display device 2 with a demodulated signal. Since the RF signal received by the signal receiving device 1 uses the frequency hopping, a used frequency band changes according to time. Moreover, it is assumed that the RF signal received by the signal receiving device 1 is a UWB (Ultra Wide Band) signal. Further, it is assumed that the RF signal is modulated by means of pulse (pulse width modulation, for example).

The graph display device 2 receives the demodulated RF signal from the signal receiving device 1, and displays physical quantities (such as an EVM and a phase error) of the RF signal and the type of the frequency band (band) used by the RF signal.

The signal receiving device 1 includes an antenna 12, an amplifier 14, an RF filter 16, an oscillator 22, a pulse generator 24, a multiplier 26, a low-pass filter 28, and a detector 29.

A reception device for the UWB signal is widely known, and only a brief description will be given thereof.

The antenna 12 receives the RF signal using the frequency hopping, and provides the amplifier 14 with the RF signal. The amplifier 14 receives the RF signal from the antenna 12, and amplifies the RF signal. The RF filter 16 removes signals in unnecessary bands such as noises from the output from the amplifier 14, extracts the RF signal, and supplies the multiplier 26 with the RF signal.

The oscillator 22 supplies the pulse generator 24 with a signal with a predetermined frequency. The pulse generator 24 generates pulses with the frequency provided by the oscillator 22. The multiplier 26 multiplies the RF signal output from the RF filter 16 and the pulse signal generated by the pulse generator 24 by each other to output a correlation therebetween. The low-pass filter 28 removes high frequency components from the output from the multiplier 26. The detector 29 receives the output from the low-pass filter 28, and detects the RF signal by means of sampling or the like, and outputs the detected RF signal to the graph display device 2.

The graph display device 2 includes an EVM measuring unit (physical quantity measuring means) 32, a phase error measuring unit (physical quantity measuring means) 34, a used band determining unit (band type determining means) 36, and a graph generator 40.

The EVM measuring unit (physical quantity measuring means) 32 measures the EVM (Error Vector Magnitude) of the RF signal in association with time based on the output from the signal receiving device 1. A measuring method of the EVM is well known, and will thus not be further explained.

The phase error measuring unit (physical quantity measuring means) 34 measures the phase error of the RF signal in association with time based on the output from the signal receiving device 1. A measuring method of the phase error is well known, and will thus not be further explained.

It can be considered that the EVM measuring unit 32 and the phase error measuring unit 34 measure the physical quantities (such as the EVM and the phase error) of the RF signal.

Figure 2:
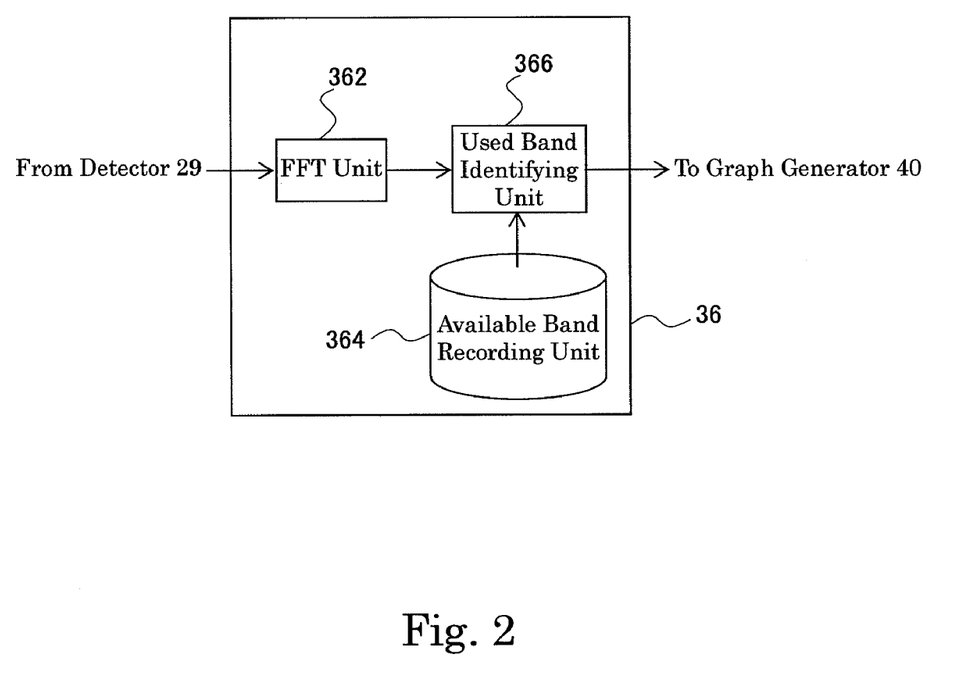
FIG. 2 is a functional block diagram showing a configuration of a used band determining unit (band type determining means) 36.

FIG. 2 is a functional block diagram showing a configuration of the used band determining unit (band type determining means) 36. The used band determining unit 36 includes an FFT unit 362, an available band recording unit 364, and a used band identifying unit 366. The used band determining unit 36 determines the type of the frequency band (band ID) used by the RF signal in association with time.

The FFT unit 362 applies the FFT (Fast Fourier Transformation) to the RF signal supplied from the signal receiving device 1 to output a frequency spectrum of the RF signal. Namely, it is possible to measure the frequency band used by the RF signal in association with time. For example, there is carried out such a measurement that the frequency band used by the RF signal at a symbol 25 (time is represented by symbols) is 3200 MHz to 3600 MHz.

Figure 3:
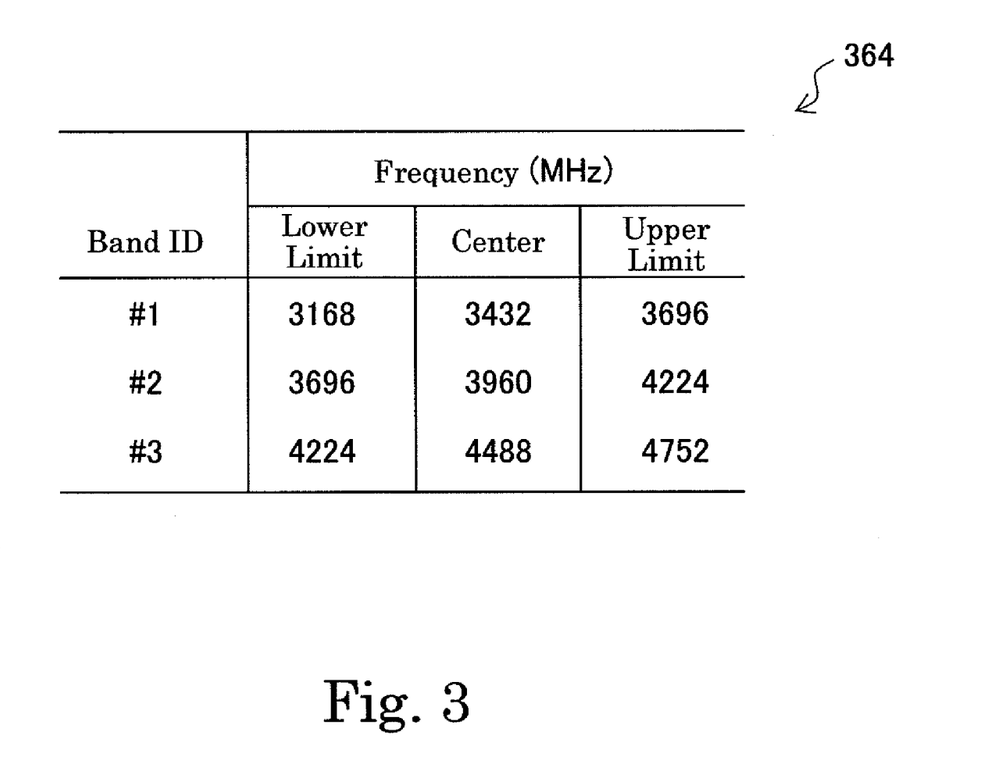
FIG. 3 is a graph showing contents recorded by an available band recording unit 364.

FIG. 3 is a graph showing contents recorded by the available band recording unit 364. The available band recording unit 364 records the frequency bands (bands) available for the RF signal. The available band recording unit 364 records contents prescribed by "MBOA Physical Layer Specification", which is a standard of the UWB. In an example shown in FIG. 3, three types of available bands (band IDs #1, #2, and #3) are recorded, and [the center frequency of the band ID #1]<[the center frequency of the band ID #2]<[the center frequency of the band id #3].

The used band identifying unit 366 identifies the band ID of the frequency band used by the RF signal by collating the frequency spectrum of the RF signal output from the FFT unit 362 against the recorded contents of the available band recording unit 364. For example, it is assumed that the FFT unit 362 measures that the RF signal is using the frequency band ranging from 3200 MHz to 3600 MHz at the symbol 25. It is also assumed that the contents recorded by the available band recording unit 364 are as shown in FIG. 3. As a result, the used band identifying unit 366 identifies that the type of the frequency band used by the RF signal at the symbol 25 is the band ID #1.

In this way, the type of the frequency band (band ID) used by the RF signal is identified in correspondence with time (symbol). For example, it is identified that bands IDs, #1, #2, #3, #1, #2, #3, #1, . . . are used respectively at the symbols 25, 26, 27, 28, 29, 30, 31, . . . .

Figure 4:
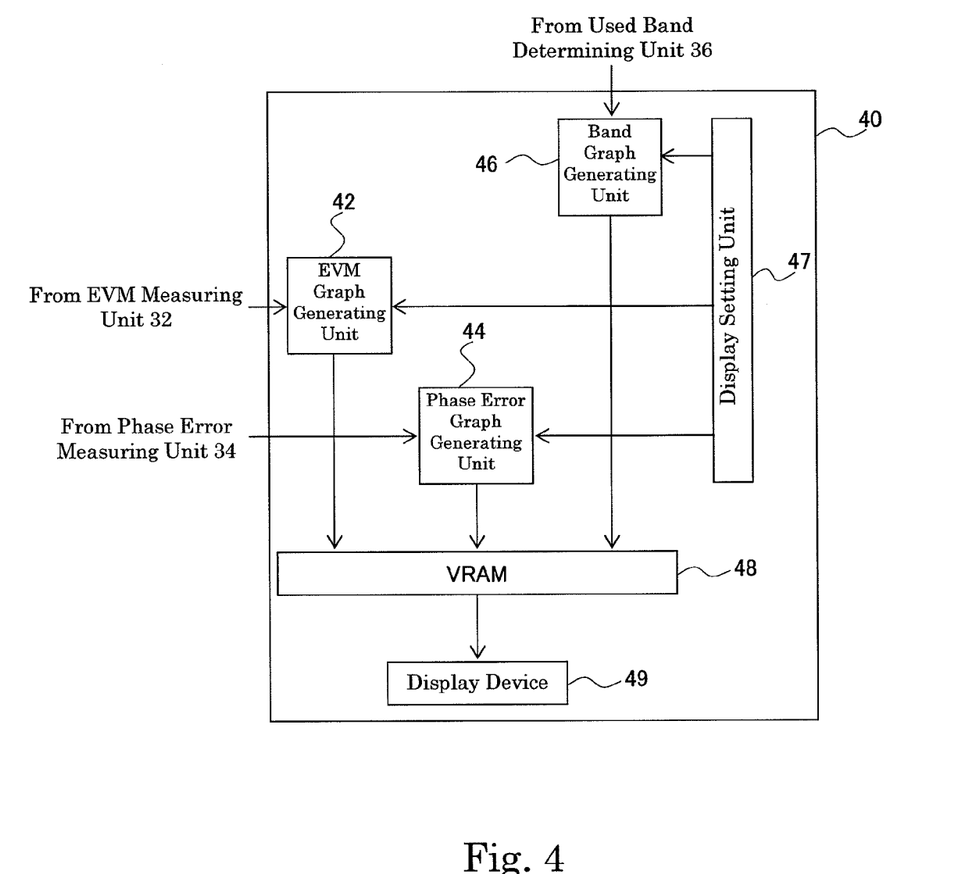
FIG. 4 is a functional block diagram showing a configuration of a graph generator 40.

FIG. 4 is a functional block diagram showing a configuration of the graph generator 40. The graph generator 40 includes an EVM graph generating unit (physical quantity display graphic generating means) 42, a phase error graph generating unit (physical quantity display graphic generating means) 44, a band graph generating unit (band display graphic generating means) 46, a display setting unit 47, a VRAM 48, and a display device 49.

The EVM graph generating unit (physical quantity display graphic generating means) 42 generates an EVM graph (physical quantity display graphic) 42b used to display the EVM, which is the physical quantity of the RF signal, on the display device 49 in association with the time axis. It should be noted that the EVM is acquired from the EVM measuring unit 32.

Figure 5:
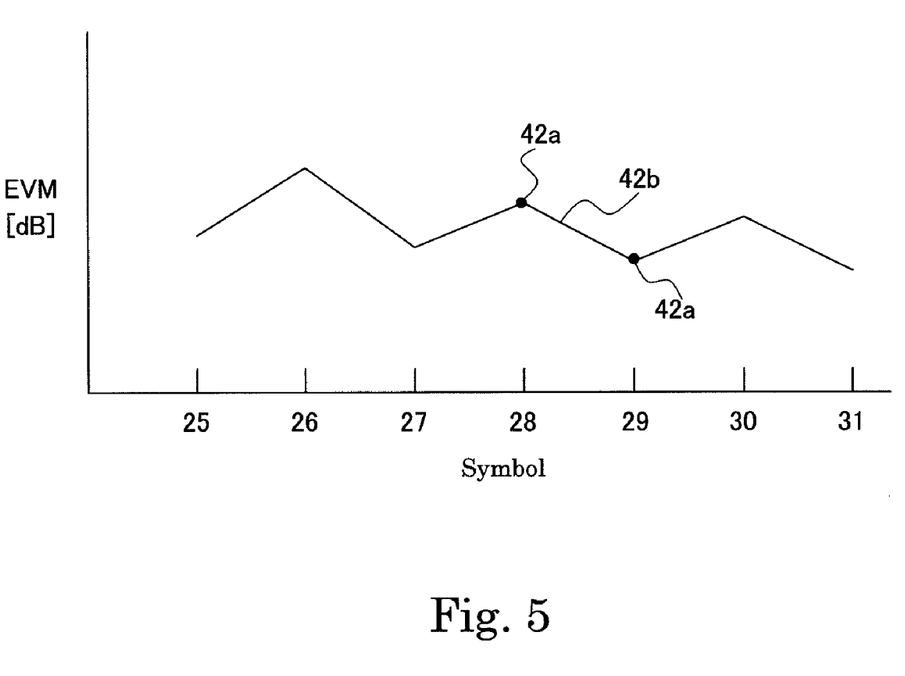
FIG. 5 is an illustration showing an EVM graph 42b generated by an EVM graph generating unit 42.

FIG. 5 is an illustration showing the EVM graph 42b generated by the EVM graph generating unit 42. The EVM graph 42b has the time axis as the horizontal axis. Though the symbols of the RF signal are shown on the time axis, items other than the symbols of the RF signal (such as "second") may be displayed as long as the items represent time. The vertical axis represents the EVM [dB] of the RF signal. The EVM graph 42b is generated by connecting display points 42a with each other by means of straight lines. It should be noted that the distance from the time axis of the display point 42a corresponds to the EVM at each symbol.

The phase error graph generating unit (physical quantity display graphic generating means) 44 generates a graph (physical quantity display graphic) used to display the phase error, which is the physical quantity of the RF signal, on the display device 49 in association with the time axis. The graph for displaying the phase error is similar to the EVM graph 42b described with reference to FIG. 5 (it should be noted that the phase error [deg] of the RF signal is shown on the vertical axis), and a description thereof, therefore, is omitted. It should be noted that the phase error is acquired from the phase error measuring unit 34.

The band graph generating unit (band display graphic generating means) 46 generates a band graph (band display graphic) 46a used to display the type of the frequency band (band ID) used by the RF signal on the display device 49 in association with the time axis. It should be noted that the band ID used by the RF signal is acquired from the used band determining unit 36.

Figure 6:
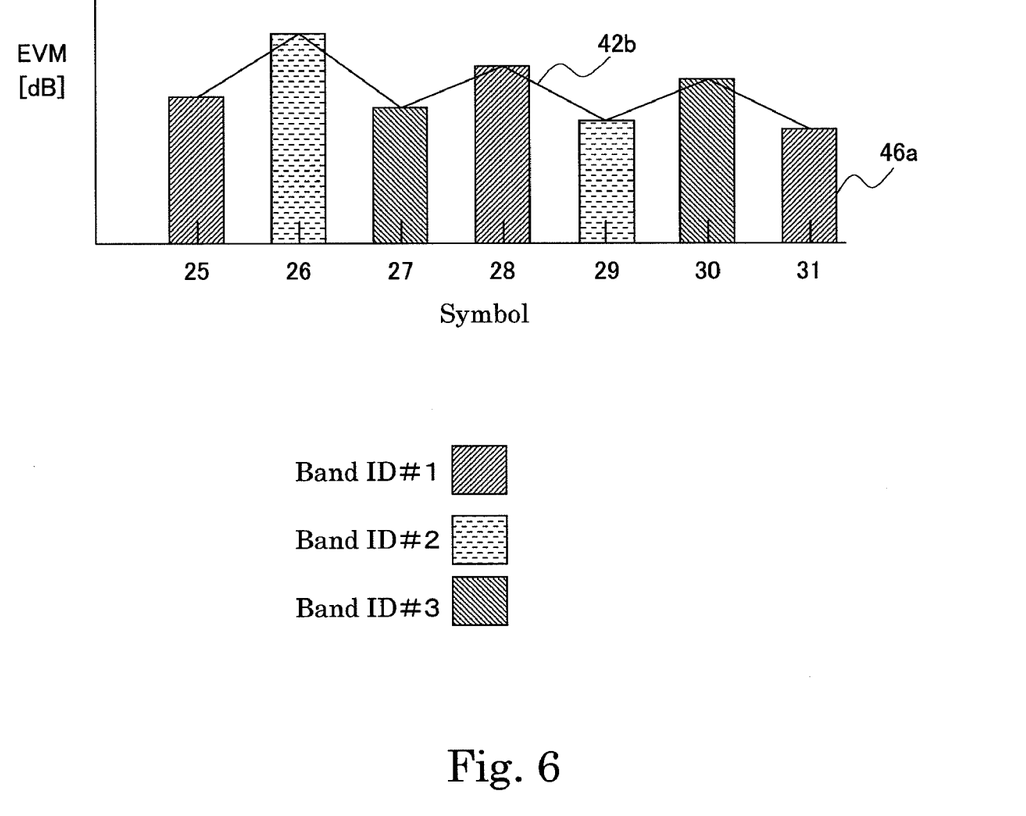
FIG. 6 is an illustration showing a band graph 46a generated by a band graph generating unit 46.

FIG. 6 is an illustration showing the band graph 46a generated by the band graph generating unit 46. It should be noted that the band graph 46a is shown as superimposed on the EVM graph 42b (refer to FIG. 5) in FIG. 6. The band graph 46a has different patterns respectively for the types of the frequency band (band IDs). As a result, one can recognize the band IDs used for the respective symbols by seeing the patterns of the band graph 46a. In the example shown in FIG. 6, the band ID #1 is used for the symbols 25, 28, and 31, the band ID #2 is used for the symbols 26 and 29, and the band ID #3 is used for the symbols 27 and 30.

It should be noted that the height of the band graph 46a (time axis (horizontal axis) is viewed as a bottom) corresponds to the EVM at the respective symbols. Moreover, the band graph 46a may have different colors for the respective band IDs. For example, the color of the band graph 46a may be configured such that the band ID #1 is represented in blue, the band ID #2 is represented in green, and the band ID #3 is represented in red. Moreover, the band graph 46a may be superimposed on the graph used to display the phase error instead of being superimposed on the EVM graph 42b.

Figure 7:
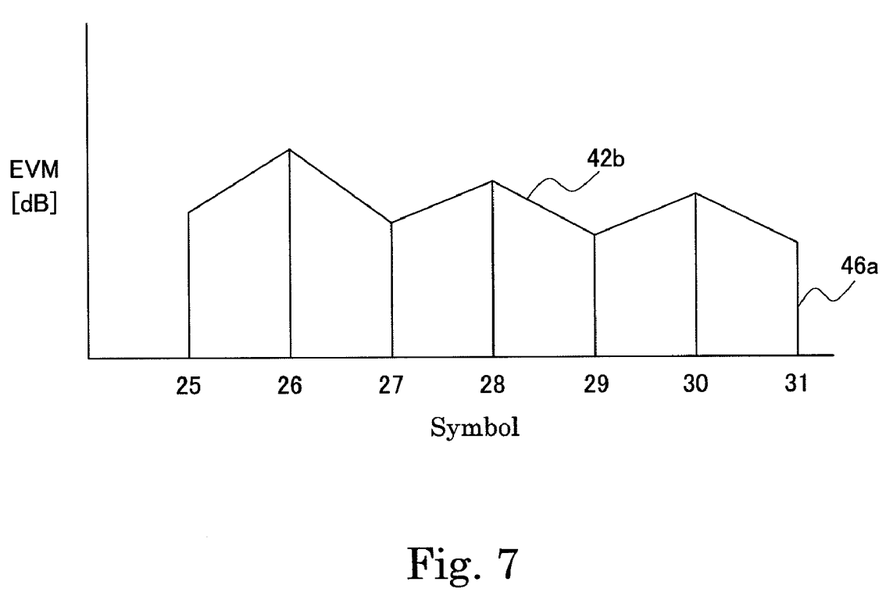

FIG. 7 is an illustration showing a first variation of the band graph 46a. As shown in FIG. 7, the band graph 46a may have a narrow width and may be a line. In this case, if different colors are used respectively for the band IDs in the band graph 46a, the band IDs used at the respective symbols can be easily recognized.

Figure 8:
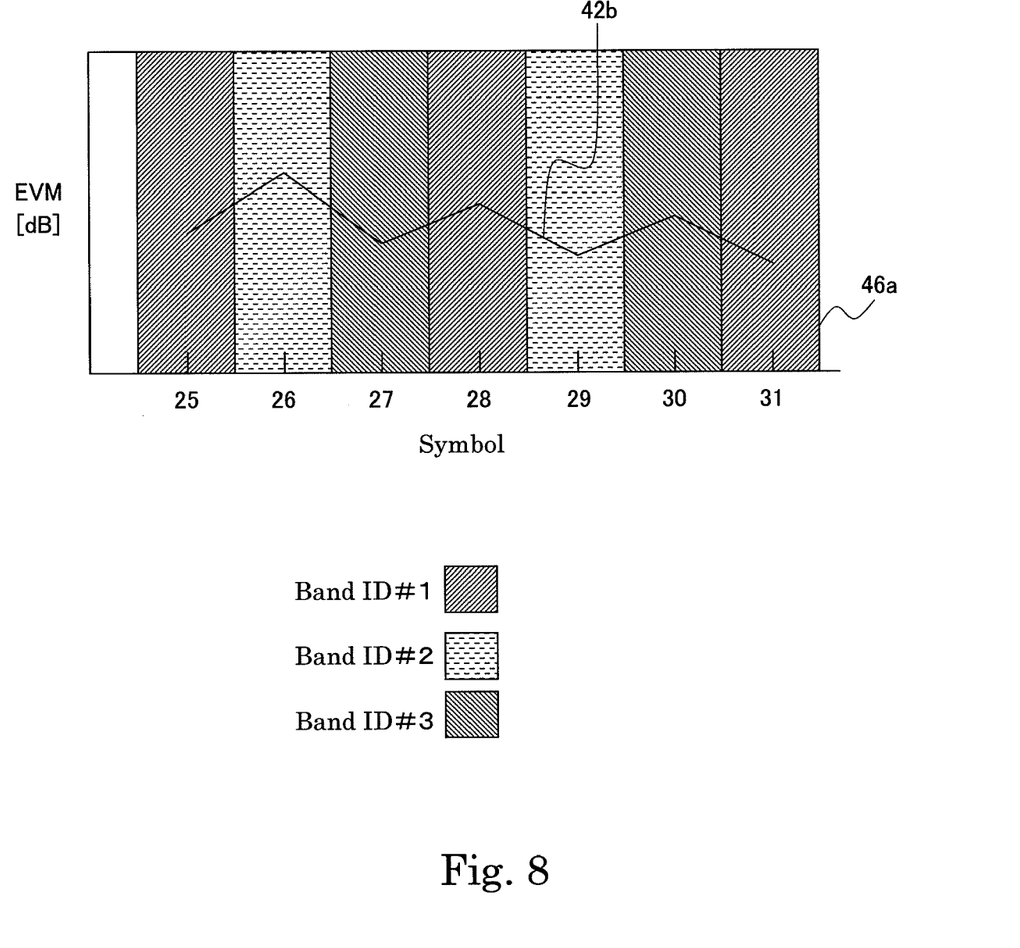

FIG. 8 is an illustration showing a second variation of the band graph 46a. As shown in FIG. 8, the band graph 46a may be configured in accordance with the band ID as patterned or colored background portions of a display area of the graph. In this way, the band graph 46a of the constant height may be used. Namely, the band graph 46a has a height (a height corresponding to the physical quantity such as the EVM or a constant height) in the direction vertical to the time axis.

With reference again to FIG. 4, the display setting unit 47 is used to set the display of the graphs. In detail, the display setting unit 47 instructs the EVM graph generating unit 42, the phase error graph generating unit 44, and the band graph generating unit 46 which graphs to output to the VRAM 48.

The display setting unit 47 is implemented by a GUI (Graphic User Interface), for example. A user of the graph display device 2 uses the display setting unit 47 to set the display of the graphs. The following settings are available.

For the physical quantity display graphics:

Either one of (1) and (2) can be selected.
(1) The EVM graph 42b is displayed.
(2) The graph for displaying the phase error is displayed.

For the band graph (band display graphic) 46a:

Any one of (3) to (6) can be selected.
(3) The bands are displayed for all band IDs #1, #2, and #3.
(4) The band is displayed only for the band ID #1.
(5) The band is displayed only for the band ID #2.
(6) The band is displayed only for the band ID #3.

If the display setting unit 47 selects (1), the EVM graph generating unit 42 outputs the EVM graph 42b, and the EVM graph is then recorded in the VRAM 48. If the display setting unit 47 selects (2), the phase error graph generating unit 44 outputs the graph for displaying the phase error, and the graph is then recorded in the VRAM 48.

If the display setting unit 47 selects (3), the band graph generating unit 46 outputs the band graph 46a (for all the band IDs #1, #2, and #3), and the band graph 46a is recorded in the VRAM 48. If the display setting unit 47 selects (4), the band graph generating unit 46 outputs the band graph 46a (only for the band ID #1), and the band graph 46a is recorded in the VRAM 48. If the display setting unit 47 selects (5), the band graph generating unit 46 outputs the band graph 46a (only for the band ID #2), and the band graph 46a is recorded in the VRAM 48. If the display setting unit 47 selects (6), the band graph generating unit 46 outputs the band graph 46a (only for the band ID #3), and the band graph 46a is recorded in the VRAM 48.

Figure 9:
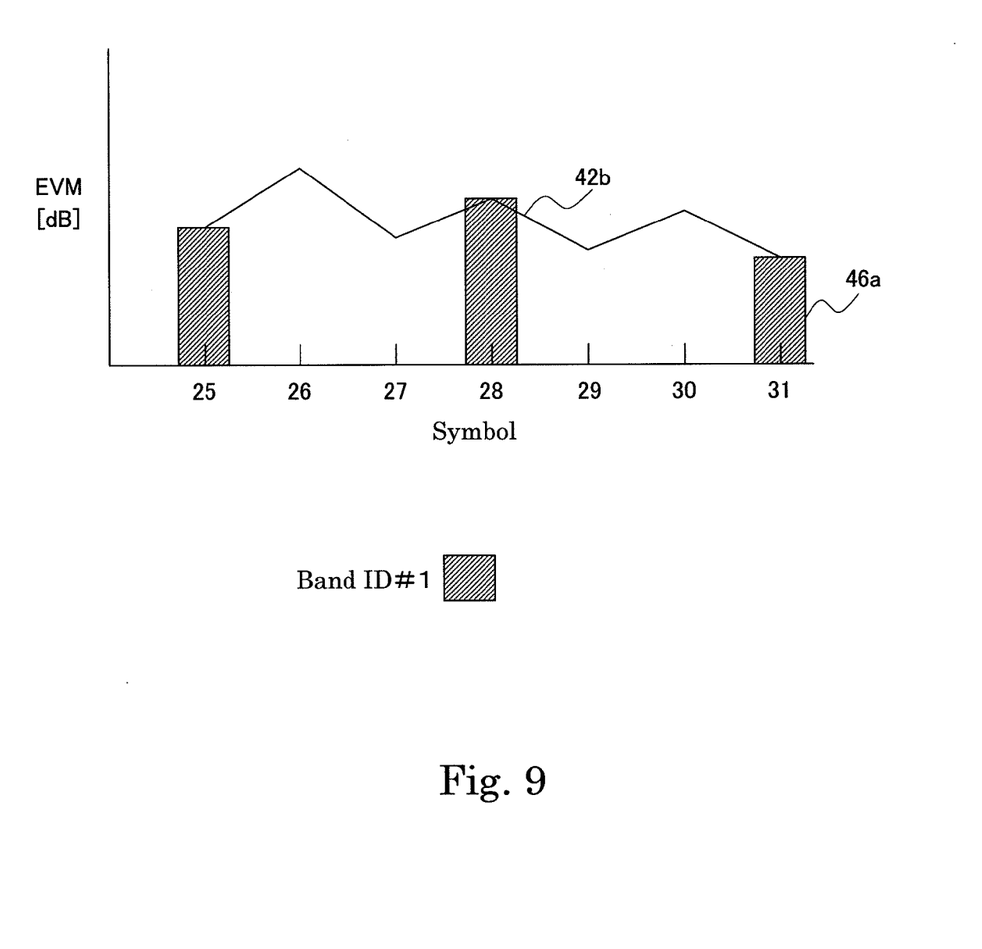
FIG. 9 is a chart showing a display form on a display device 49.

FIG. 9 is a chart showing a display form on the display device 49 if "(1) The EVM graph 42b is displayed" and "(4)

The band is displayed only for the band ID #1" are set by the display setting unit 47. As shown in FIG. 9, the band graph 46a is shown only for the band ID #1, and is not shown for the band IDs #2 and #3. It should be noted that FIGS. 6 to 8 show a display form on the display device 49 if "(1) The EVM graph 42b is displayed" and "(3) The bands are displayed for all band IDs #1, #2, and #3" are set.

The VRAM (Video Random Access Memory) 48 records the display graphics (graphs) output from the EVM graph generating unit 42, the phase error graph generating unit 44, and the band graph generating unit 46.

The display device 49 reads out the display graphics (graphs) from the VRAM 48, and displays the display graphics.

A description will now be given of an operation of the embodiment of the present invention.

If an RF signal (UWB signal) using the frequency hopping is received by the antenna 12 of the signal receiving device 1, the RF signal is amplified by the amplifier 14, and signals in unnecessary bands such as noises are removed by the RF filter 16, and the resulting signal is supplied to the multiplier 26.

Moreover, the pulse generator 24 generates the pulses with the frequency specified by the oscillator 22, and supplies the multiplier 26 with the pulses.

The multiplier 26 multiplies the RF signal output from the RF filter 16 and the pulse signal generated by the pulse generator 24 by each other to output the correlation therebetween. High frequency components are removed from the output from the multiplier 26 by the low-pass filter 28. The detector 29 receives the output from the low-pass filter 28, and detects the RF signal by means of sampling or the like, and outputs the detected RF signal to the graph display device 2.

Figure 10:
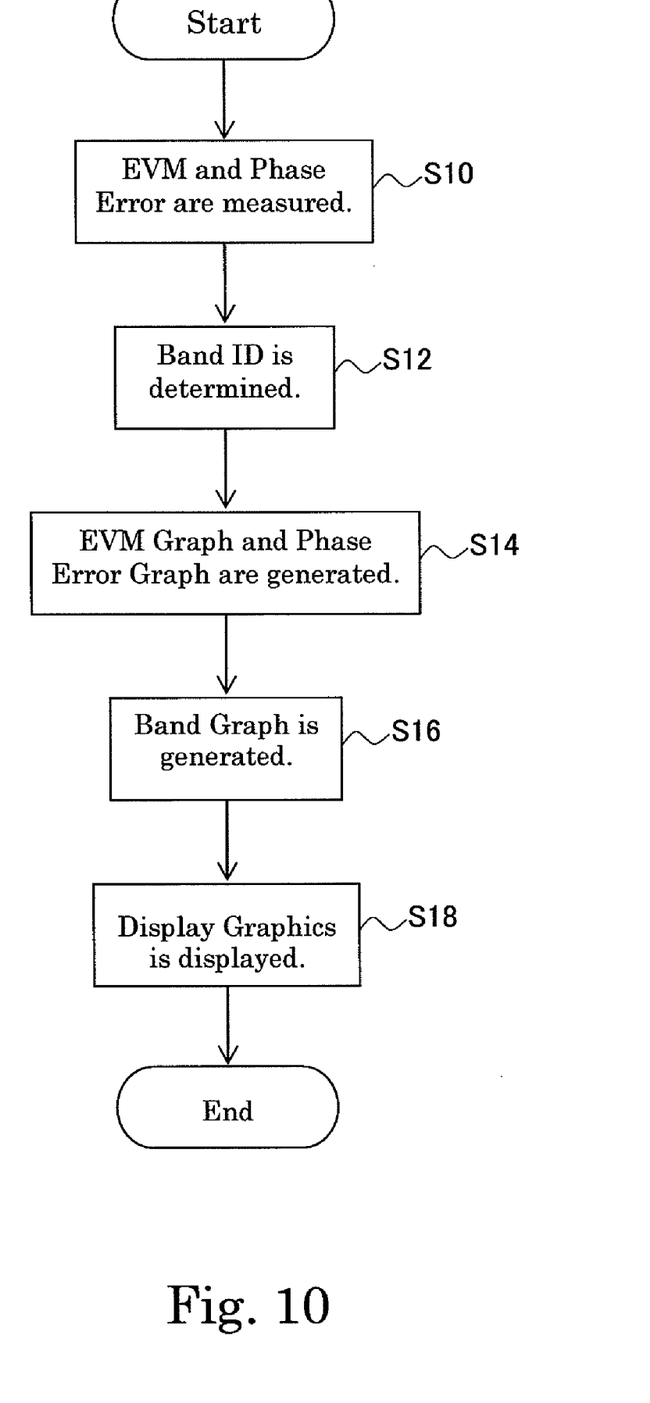
FIG. 10 is a flowchart showing an operation of the graph display device 2 according to the embodiment of the present invention.

FIG. 10 is a flowchart showing the operation of the graph display device 2 according to the embodiment of the present invention.

The output of the detector 29 of the signal receiving device 1 is supplied to the EVM measuring unit (physical quantity measuring means) 32 and the phase error measuring unit (physical quantity measuring means) 34. The EVM measuring unit 32 measures the EVM of the RF signal, and the phase error measuring unit 34 measures the phase error of the RF signal (S10).

Moreover, the output of the detector 29 of the signal receiving device 1 is also supplied to the used band determining unit (band type determining means) 36. The used band determining unit 36 determines the type of the frequency band (band ID) used by the RF signal in association with time (S12).

The EVM graph generating unit (physical quantity display graphic generating means) 42 then receives the result measured by the EVM measuring unit 32, and generates the EVM graph 42b (S14). Then, the phase error graph generating unit (physical quantity display graphic generating means) 44 receives the result measured by the phase error measuring unit 34, and generates the graph to display the phase error (referred to as "phase error graph") (S14).

The band graph generating unit (band display graphic generating means) 46 receives the output from the used band determining unit 36, and generates the band graph 46a (S16).

Graphs selected by the display setting unit 47 from the EVM graph 42b, the phase error graph, and the band graph 46a are written in the VRAM 48.

The display device 49 finally reads out the display graphics (graphs) from the VRAM 48, and displays the display graphics (S18).

According to the embodiment of the present invention, it is possible to show which symbol (or which time point (in second)) and which type of frequency band (band ID) physical quantities (such as the EVM and the phase error) of an RF signal (such as UWB signal) using the frequency hopping correspond to.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the EVM graph generating unit 42, the phase error graph generating unit 44, and the band graph generating unit 46), thereby installing the program on the hard disk. This method may also realize the above-described embodiment.

The invention claimed is:

1. A measuring device comprising:
    a physical quantity measurer that measures, in association with time, a physical quantity of a signal, which uses different frequency bands according to time;
    a band type determiner that determines the type of the frequency band used by the signal in association with time;
    a physical quantity display graphic generator that generates a physical quantity display graphic used to display the physical quantity on a display device in association with a time axis; and
    a band display graphic generator that generates a band display graphic used to display the type of the frequency band on the display device in association with the time axis,
    wherein the band display graphic is a graphic having a predetermined height in a direction perpendicular to the time axis.

2. The measuring device according to claim 1, wherein the band display graphic is different in color or pattern according to the type of the frequency band.

3. The measuring device according to claim 1, wherein the physical quantity is an EVM or a phase error.

4. The measuring device according to claim 1, wherein a symbol of the signal is displayed on the time axis.

5. The measuring device according to claim 1, wherein the physical quantity display graphic is formed by connecting display point whose distance from the time axis corresponds to the physical quantity.

6. The measuring device according to claim 1, wherein the predetermined height of the band display graphic corresponds to the physical quantity.

7. The measuring device according to claim 1, wherein the predetermined height of the band display graphic is constant.

8. The measuring device according to claim 1, wherein the band display graphic is displayed only for a specific frequency band.

9. A measuring method comprising:
    measuring, in association with time, a physical quantity of a signal, which uses different frequency bands according to time;
    determining the type of the frequency band used by the signal in association with time;
    generating a physical quantity display graphic used to display the physical quantity on a display device in association with a time axis; and
    generating a band display graphic used to display the type of the frequency band on the display device in association with the time axis, wherein the band display graphic is a graphic having a predetermined height in a direction perpendicular to the time axis.

10. A computer-readable medium having a program of instructions for execution by the computer to perform a measuring processing; said measuring processing comprising:

measuring, in association with time, a physical quantity of a signal, which uses different frequency bands according to time;

determining the type of the frequency band used by the signal in association with time;

generating a physical quantity display graphic used to display the physical quantity on a display device in association with a time axis; and generating a band display graphic used to display the type of the frequency band on the display device in association with the time axis, wherein the band display graphic is a graphic having a predetermined height in a direction perpendicular to the time axis.

* * * * *